United States Patent
Sato et al.

(10) Patent No.: US 12,283,313 B2
(45) Date of Patent: *Apr. 22, 2025

(54) LOW-POWER STATIC RANDOM ACCESS MEMORY

(71) Applicant: UNTETHER AI CORPORATION, Toronto (CA)

(72) Inventors: Katsuyuki Sato, Tokyo (JP); William Martin Snelgrove, Toronto (CA)

(73) Assignee: UNTETHER AI CORPORATION, Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/235,935

(22) Filed: Aug. 21, 2023

(65) Prior Publication Data

US 2023/0395141 A1    Dec. 7, 2023

Related U.S. Application Data

(63) Continuation of application No. 18/251,251, filed as application No. PCT/IB2022/055759 on Jun. 21, 2022, now Pat. No. 11,990,181.

(Continued)

(51) Int. Cl.
*G11C 11/419*    (2006.01)
*G11C 5/14*    (2006.01)
(Continued)

(52) U.S. Cl.
CPC ............. *G11C 11/419* (2013.01); *G11C 5/14* (2013.01); *G11C 7/1048* (2013.01); *G11C 7/12* (2013.01); *G11C 7/18* (2013.01)

(58) Field of Classification Search
CPC .................................................. G11C 11/419
(Continued)

(56) References Cited

U.S. PATENT DOCUMENTS 5,008,609 A * 4/1991 Fukiage ............... G05F 3/24
                                                              327/535
5,091,889 A 2/1992 Hamano et al.
(Continued)

FOREIGN PATENT DOCUMENTS

WO    WO-2020182983 A1    9/2020

OTHER PUBLICATIONS

Zhang, Hanzun, et al. "A low-Power SRAM with charge cycling based read and write assist scheme." 2020 IEEE 15th International Conference on Solid-State & Integrated Circuit Technology (ICSICT). IEEE, 2020.

(Continued)

*Primary Examiner* — Sung Il Cho
(74) *Attorney, Agent, or Firm* — PERRY + CURRIER INC.

(57) ABSTRACT

A low-power static random access memory (SRAM) is set forth which includes a cache memory function without requiring a special bit cell, and which realizes robust read and write operation without any write assist circuit at 16 nm or below FinFET technology. The SRAM comprises a half-Vdd precharge 6 T SRAM cell array for robust operation at low supply voltage at 16 nm or below, and with cacheable dynamic flip-flop based differential amplifier referred to as a main amplifier (MA). Prior art 6 T SRAM cell arrays use Vdd or Vdd-Vth precharge schemes, and have separate read and write amplifiers. The SRAM set forth uses one main amplifier only, which is connected to the bit line (BL) through a transmission gate. The main amplifiers functions as a read amplifier, write amplifier, and a cache memory.

4 Claims, 16 Drawing Sheets

Related U.S. Application Data

(60) Provisional application No. 63/213,393, filed on Jun. 22, 2021.

(51) Int. Cl.
*G11C 7/10* (2006.01)
*G11C 7/12* (2006.01)
*G11C 7/18* (2006.01)

(58) Field of Classification Search
USPC ........................................................ 365/154
See application file for complete search history.

(56) References Cited

U.S. PATENT DOCUMENTS

| | | | |
|---|---|---|---|
| 5,956,274 A | 9/1999 | Elliott et al. | |
| 5,970,003 A | 10/1999 | Miyatake et al. | |
| 6,067,257 A | 5/2000 | Kitsukawa et al. | |
| 6,279,088 B1 | 8/2001 | Elliott et al. | |
| 6,538,910 B1* | 3/2003 | Spitz | H02M 7/062 363/126 |
| 6,560,684 B2 | 5/2003 | Elliott et al. | |
| 7,155,581 B2 | 12/2006 | Elliott et al. | |
| 7,660,167 B1 | 2/2010 | Roge et al. | |
| 10,175,839 B2 | 1/2019 | Srivastava et al. | |
| 10,331,282 B2 | 6/2019 | Srivastava et al. | |
| 10,916,275 B1* | 2/2021 | Ghosh | G11C 11/419 |
| 2002/0122345 A1 | 9/2002 | Feurle | |
| 2009/0161465 A1 | 6/2009 | Lee et al. | |
| 2010/0265778 A1 | 10/2010 | Yasuda | |
| 2012/0014172 A1 | 1/2012 | Jung et al. | |
| 2012/0014173 A1 | 1/2012 | Deng | |
| 2012/0314468 A1 | 12/2012 | Siau et al. | |
| 2013/0148414 A1 | 6/2013 | Shu et al. | |
| 2013/0235682 A1 | 9/2013 | Kim | |
| 2014/0016402 A1 | 1/2014 | Burnett et al. | |
| 2014/0210511 A1* | 7/2014 | Bartling | H03K 19/173 326/38 |
| 2015/0263731 A1* | 9/2015 | Kushiyama | H03K 19/017 327/333 |
| 2016/0103458 A1* | 4/2016 | Shukla | G05F 1/468 323/280 |
| 2016/0118091 A1 | 4/2016 | Asenov et al. | |
| 2016/0183338 A1* | 6/2016 | Loomis | H05B 45/48 315/185 R |
| 2017/0206949 A1 | 7/2017 | Pickering | |
| 2019/0147942 A1* | 5/2019 | Jain | G11C 11/419 365/156 |
| 2019/0305971 A1 | 10/2019 | Li et al. | |
| 2019/0340069 A1 | 11/2019 | Kumar et al. | |
| 2020/0020388 A1 | 1/2020 | Arsovski et al. | |
| 2020/0210637 A1* | 7/2020 | Kang | G06F 30/373 |
| 2021/0149763 A1 | 5/2021 | Ranganathan et al. | |

OTHER PUBLICATIONS

Chen et al. "A 16 nm 128 Mb SRAM in High-$\kappa$ metal-gate FinFET technology with write-assist circuitry for low-VMIN applications." IEEE Journal of Solid-State Circuits 50.1 (2014): 170-177.

PCT/IB2022/055759, Low-Power Static Random Access Memory, filed Jun. 21, 2022.

U.S. Appl. No. 18/251,251, Low-Power Static Random Access Memory, filed May 1, 2023.

PCT/IB2022/055760, Low-Power Static Random Access Memory, filed Jun. 21, 2022.

U.S. Appl. No. 18/000,694, Low-Power Static Random Access Memory, filed Dec. 5, 2022.

U.S. Appl. No. 18/235,954, Low-Power Static Random Access Memory, filed Aug. 21, 2023.

\* cited by examiner

LOW-POWER STATIC RANDOM ACCESS MEMORY

CROSS-REFERENCE TO RELATED APPLICATION(S)

This application is a continuation of U.S. patent application Ser. No. 18/251,251, filed Jun. 21, 2022, which is a 371 continuation of PCT/IB2022/055759, filed Jun. 21, 2022, which claims priority to U.S. Patent Application 63/213,393, filed Jun. 22, 2021, the contents of which are incorporated herein by reference.

BACKGROUND OF THE INVENTION

1. Field of the Invention

The present invention is directed to static random access memory (hereinafter SRAM), and more particularly to SRAM operable in multiple different voltage domains.

2. Description of the Related Art

There has been an ever-increasing need to reduce power dissipation in traditional SRAMs (e.g. Vdd supply voltage of 0.5 V or less), wherein a plurality of memory cells (hereinafter MCs) along a selected word-line (hereinafter WL) are simultaneously read or written, while the rest, referred to as half-select MCs, are virtually read or written. Recently, this need has become more pressing with the introduction of emerging SRAMs used in AI-chips, wherein all of the MCs are simultaneously read or written for massively parallel operations between processor element blocks and the SRAMs.

Indeed, semiconductor foundries provide 0.5V as the core voltage for 16 nm FinFET technology. However, the SRAM operation voltage is higher than the core voltage, (e.g. 0.8V for 16 nm FinFET technology) giving rise to the use of write assist circuitry (see Y. H. Chen et al., "A 16 nm 128 Mb SRAM in High-Metal-Gate FinFET Technology With Write-Assist Circuitry for Low-VMIN Applications," IEEE Journal Of Solid-State Circuits, Vol. 50, No. 1, January 2015).

Additional prior art relevant to this disclosure includes: K. Ishibashi and K. Osada editors, "Low Power and Reliable SRAM Memory Cell and Array Design," Springer Series in Advanced Microelectronics 3, April 2011, and GeeksforGeeks; Cache Memory in Computer Organization.

SUMMARY OF THE INVENTION

According to aspects of this specification, a method and apparatus are set forth for operating SRAM under two different voltage domains, such as 0.5V and 0.8V for 16 nm FinFET technology, without any requirement for special circuitry such as write assist circuitry, which requires a negative voltage for a zero data write.

It is an aspect of the present invention to provide a static random-access memory comprising at least one six-transistor memory cell arranged between a first bitline, a second bitline and a word line; a bitline precharge circuit for precharging the first bitline and second bitline to a voltage of Vdd/2 prior to the at least one six-transistor memory cell receiving a word line signal; a main amplifier for receiving signals on data lines din and /din in a first voltage domain via a gate WEi; and a main amplifier precharge circuit for precharging the main amplifier in response to a signal /PEMA such that the main amplifier amplifies signals in the first voltage domain to a second domain.

The above aspects can be attained by a circuit for generating a half Vdd voltage from a main on-chip supply voltage Vdd/Vss comprising series connected transistors M1 and M2 in parallel with series connected transistors M3 and M4, connected between Vdd and Vss, with the half Vdd voltage output from a node connecting transistors M1, M2, M3 and M4, wherein transistors M1 and M3 function as a self-biased inverter and transistors M2 and M4 function as current sensing transistors.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1b shows column precharge multiplexer and sense/write amplifiers of the prior art SRAM cell array depicted in FIG. 1a.

DETAILED DESCRIPTION OF THE PREFERRED EMBODIMENTS

Figure 1A:
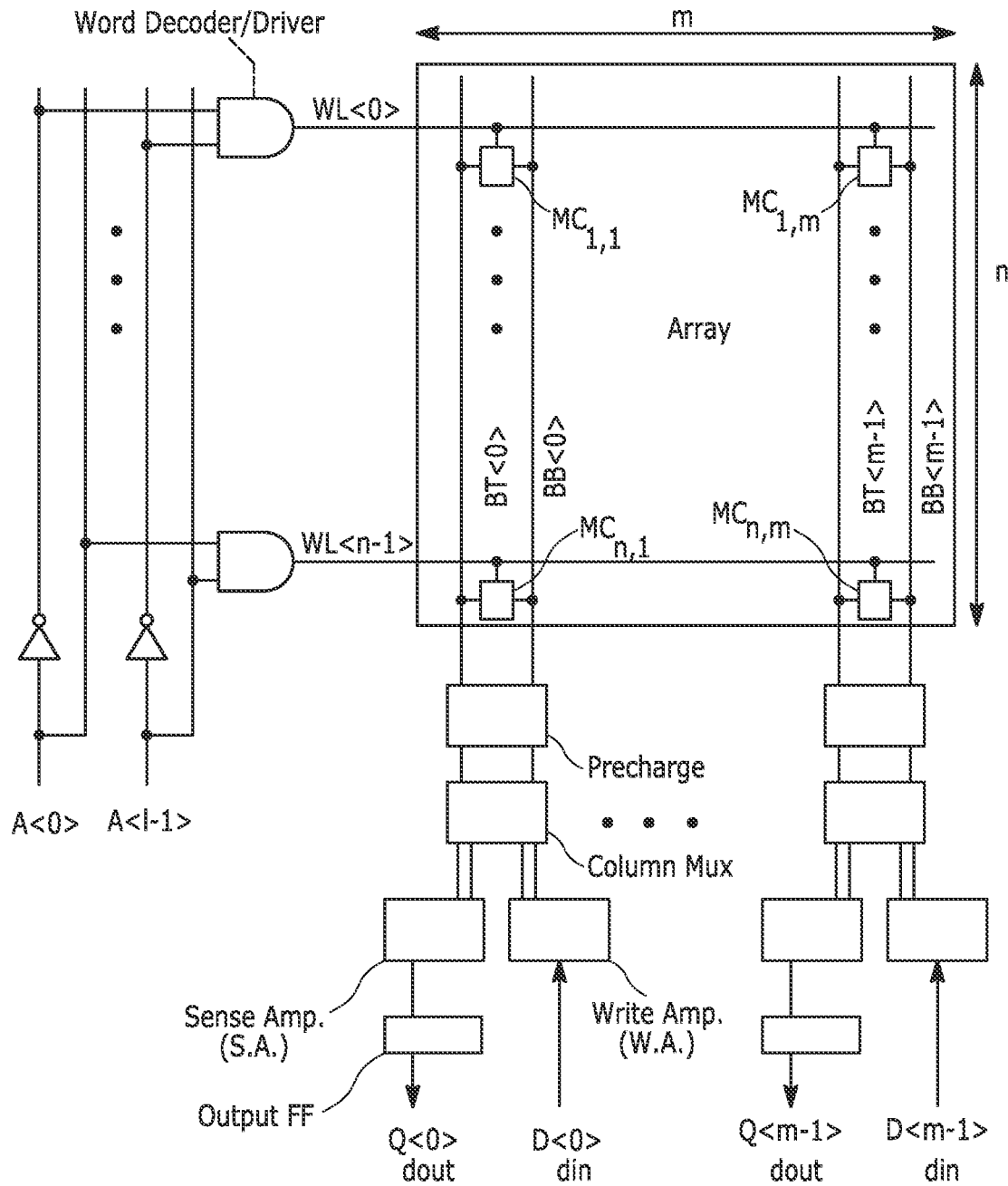
FIG. 1a shows a SRAM cell array according to the prior art.

A conventional SRAM cell array is shown in FIG. 1a, comprising a plurality of SRAM cells $MC_{1,1}$ ... $MC_{1,m}$ ... $MC_{n,1}$ ... $MC_{n,m}$, to which binary data (dout, din) is read/written on BLs BT<0>/BB<0>. . . BT<m−1>/BB<m−1> via column precharge, multiplexers (column mux), and sense/write amplifiers ((S.A.) and W.A., respectively), in response to read/write signals on word lines WL<0> ... WL<n−1>. The structures of the conventional column precharge multiplexer, column multiplexer and sense/write amplifiers are depicted in FIG. 1b.

Figure 1B:
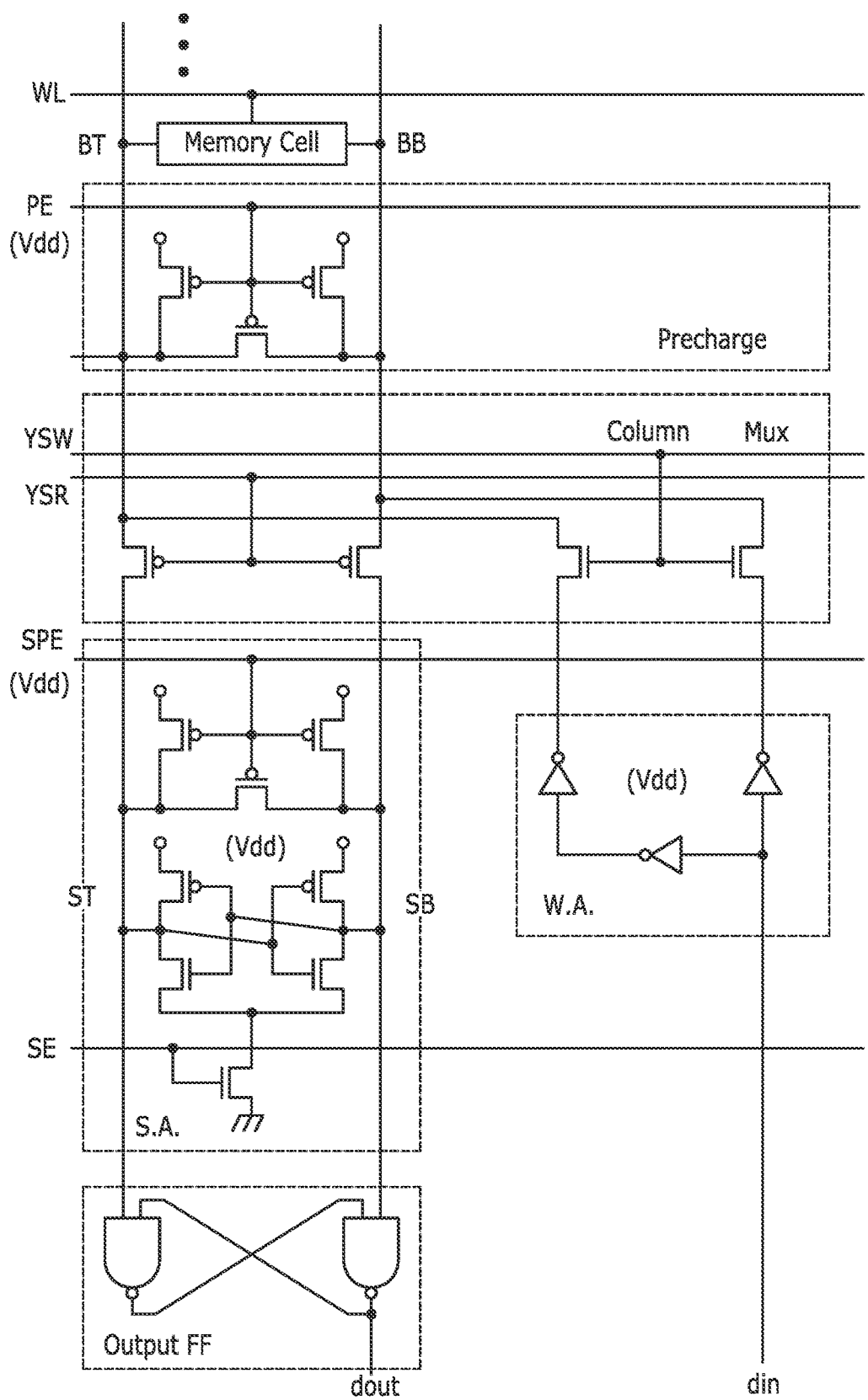

In FIGS. 1a and 1b, only one voltage domain is used for the column precharge multiplexer and sense/write amplifiers, namely Vdd. However, in the event the logic that generates din and receives dout operates in a different voltage domain (e.g. if the logic operates at 0.4V and the SRAM operates at 0.8V for 16 nm FinFET technology), a level shifter is required to convert the voltage from 0.4V to 0.8V before din is input to the W.A., because W.A. operates at 0.8V. A disadvantage of using such a level shifter is that it consumes considerable power and surface layout area.

Figure 2A:
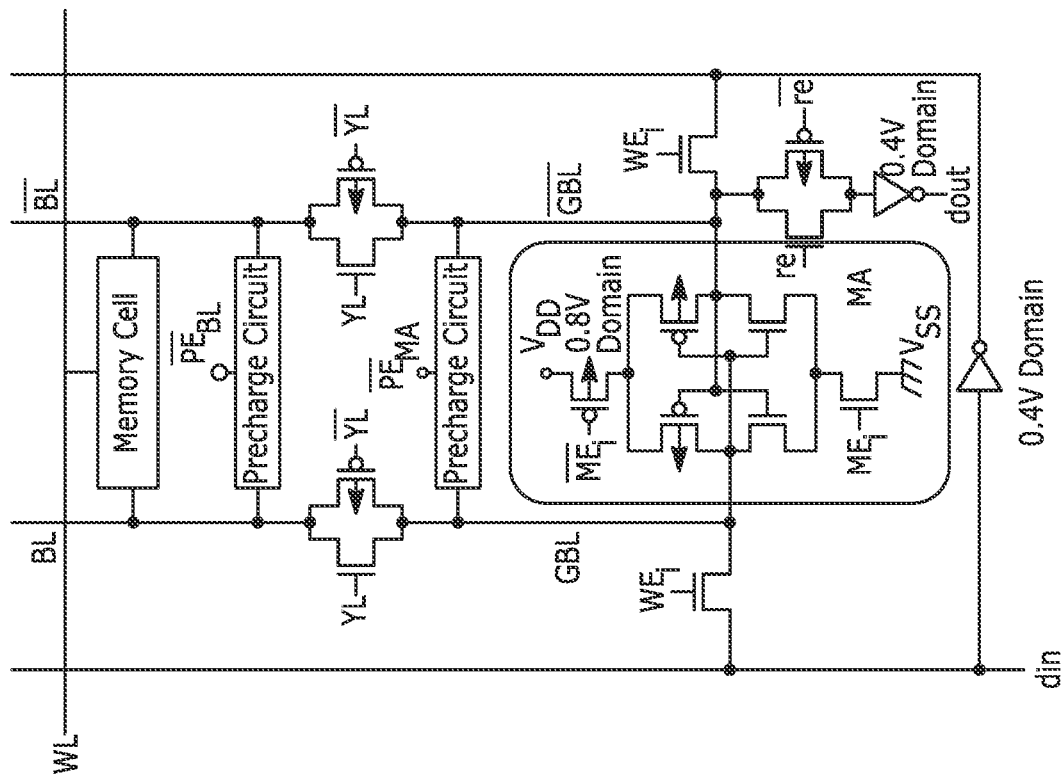
FIGS. 2a and 2b show embodiments of circuits for writing to an MC without a level shifter.
Figure 2B:
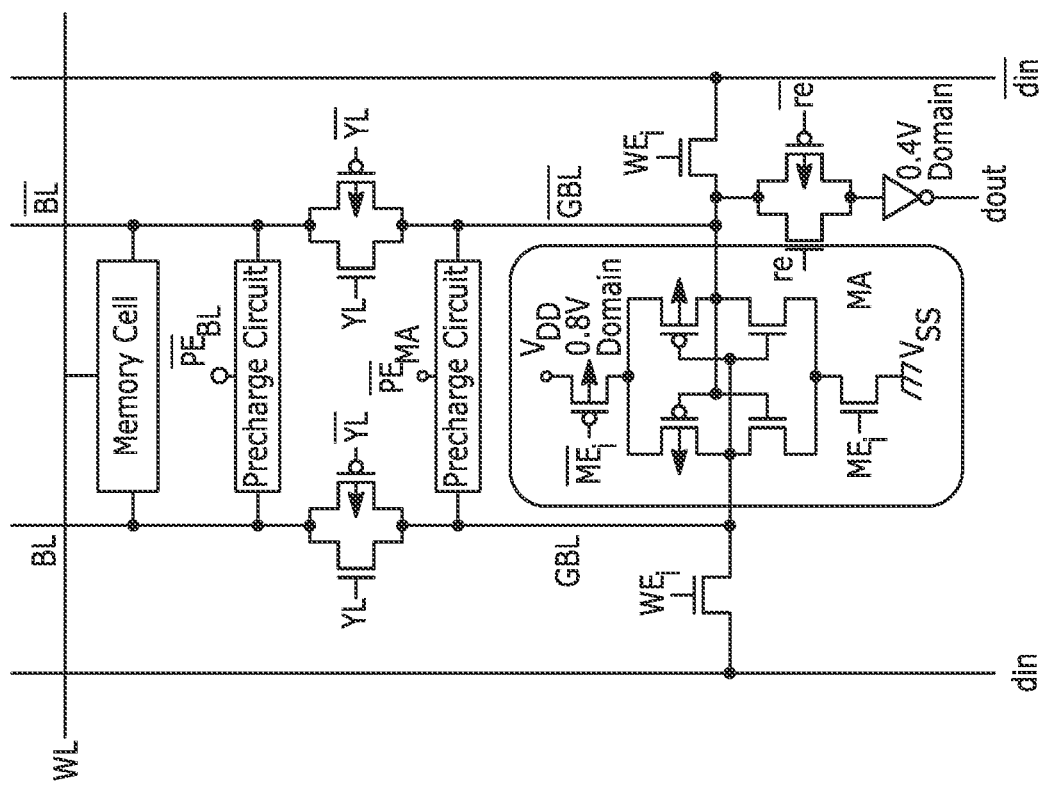

According to exemplary embodiments, circuits for writing to an MC without a level shifter are shown in FIGS. 2a and 2b. In FIG. 2a, din and /din are received from external logic in a first voltage domain (e.g. din=0.4V and /din=0 V) and are applied to a main amplifier (MA) via a gate WEi. After WEi turns off, MA amplifies the 0.4V and 0V signals in the first voltage domain to 0.8V and 0V, respectively, as shown in FIG. 2d. GBL and /GBL are connected to BL and /BL, respectively, through transmission switches controlled by YL and /YL gate signals. A bitline precharge circuit is enabled by signal /$PE_{BL}$, and a main amplifier precharge circuit is enabled by signal /$PE_{MA}$. The MA in FIGS. 2a and 2b therefore functions as a write amplifier that includes level shifting functionality.

In the embodiment of FIG. 2b, only din is received from the external logic. The complementary signal (/din) is generated by an inverter that is operated at 0.4V. After /din is generated, din and /din are amplified by MA and sent to BL and /BL, in the same way as the embodiment of FIG. 2a.

Figure 2C:
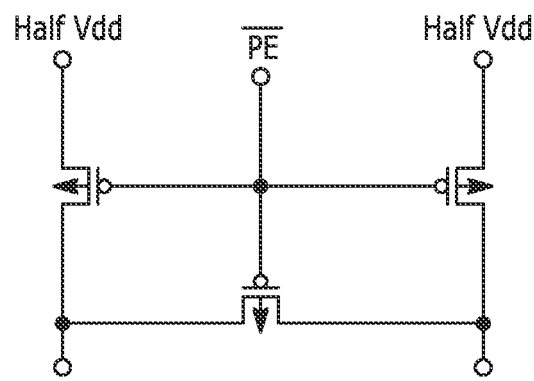
FIG. 2c shows an exemplary precharge circuit for the circuits of FIGS. 2a and 2b.
Figure 2D:
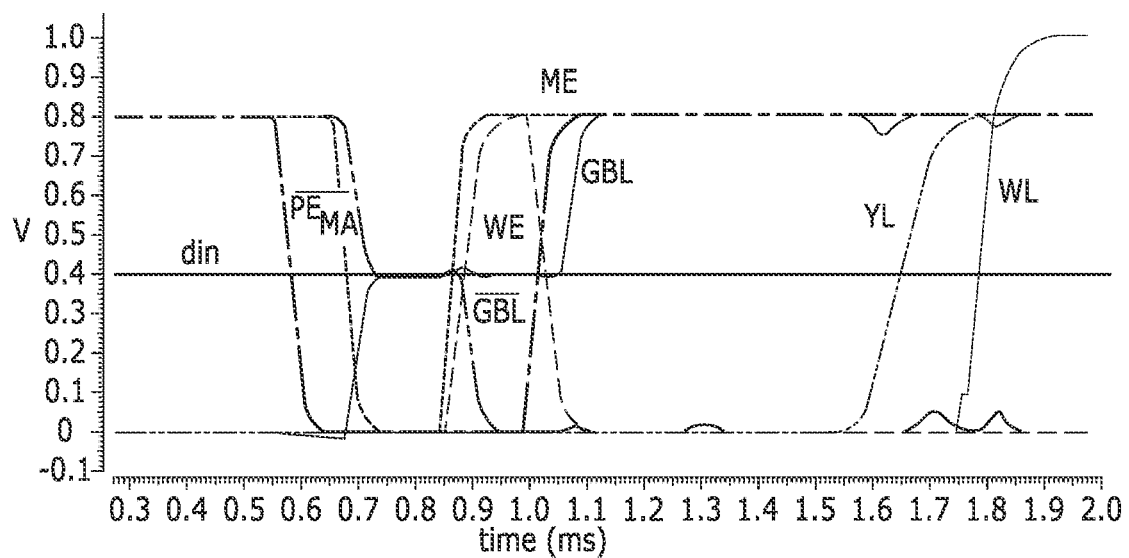
FIG. 2d is a timing diagram for the signals for the circuits in FIGS. 2a, 2b and 2c.

An embodiment of the precharge circuit in FIGS. 2a and 2b, is shown in FIG. 2c.

In the case of a data read, the read data passes from the MC to MA through the transmission gates upon application of gate control signals YL and /YL, and is amplified by MA for output as dout, which is level shifted to the 0.4V domain via an output inverter, as shown in FIGS. 2a and 2b.

Figure 3:
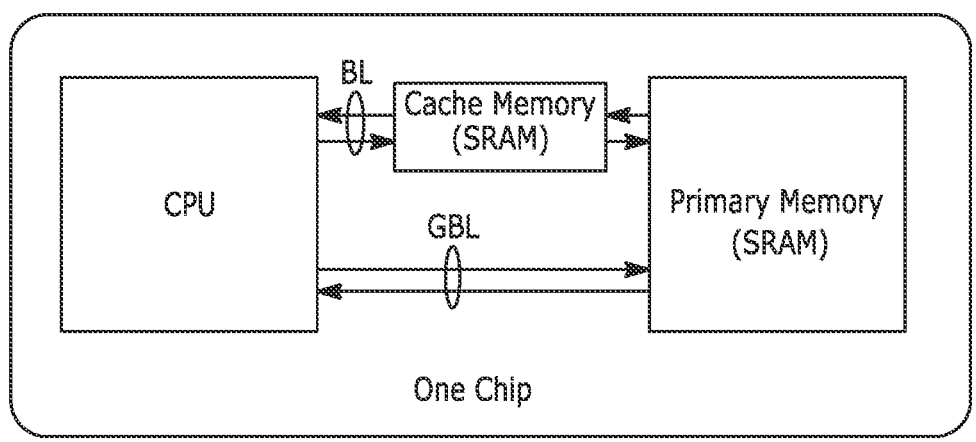
FIG. 3 is a simplified block diagram of a prior art memory system having a primary memory and cache memory.

In the simplified prior art memory system shown in the block diagram of FIG. 3, a CPU communicates with cache memory and a primary memory, where the cache memory stores a portion of the data of the primary memory, and is commonly referred to as the cache line. In a single die (i.e. one chip), each of the cache memory and primary memory are SRAM. In FIG. 3, the CPU communicates with the cache memory and primary memory over different bit line (BL) and global bit line (GBL) busses. The bus configuration and control in such a memory system can become complicated and consume layout area.

Figure 4:
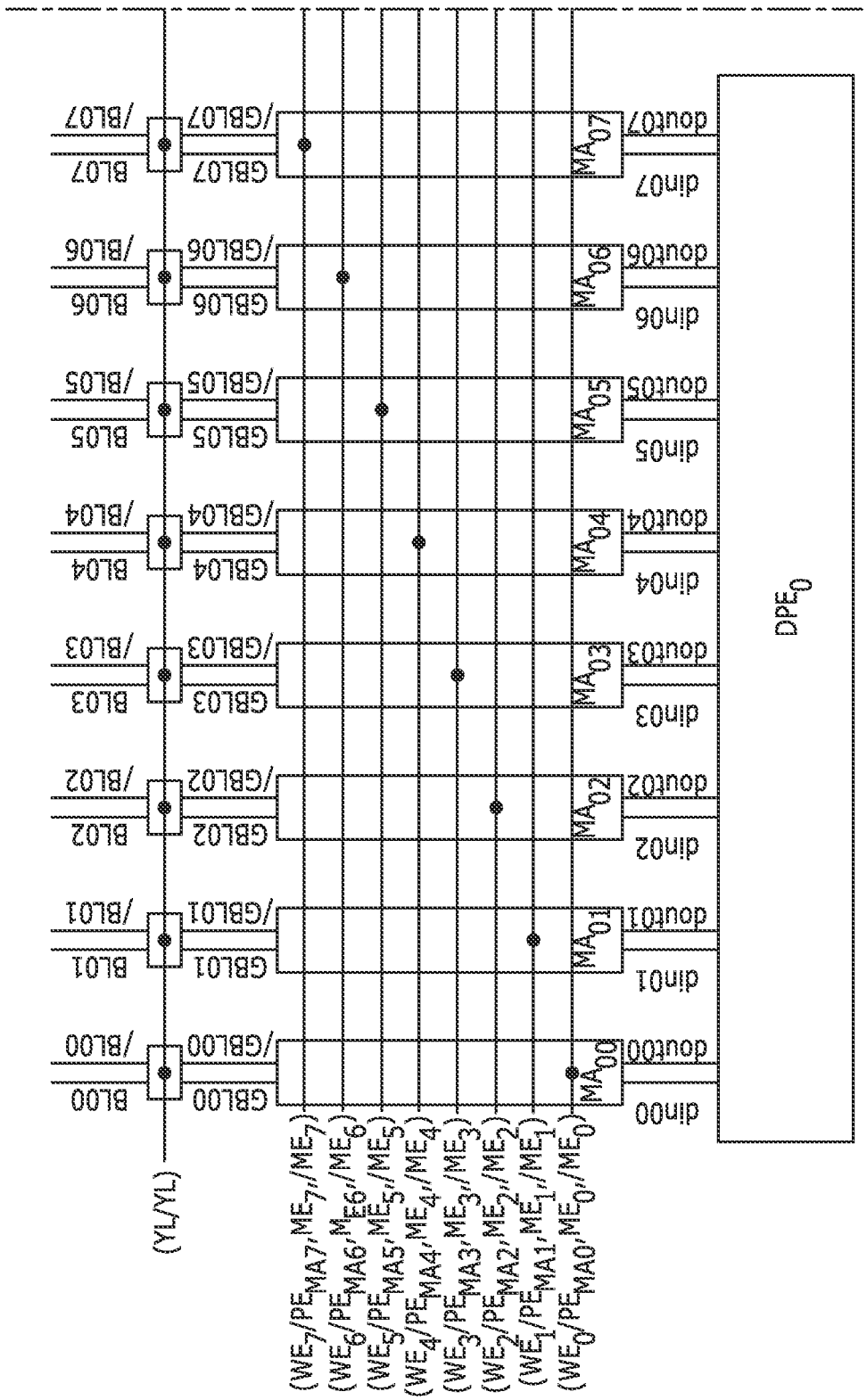
FIG. 4 illustrates use of the circuits of FIGS. 2a and 2b for the cache memory of FIG. 3 connected to a deep learning processing element (DPE) of an AI system.
Figure 4:
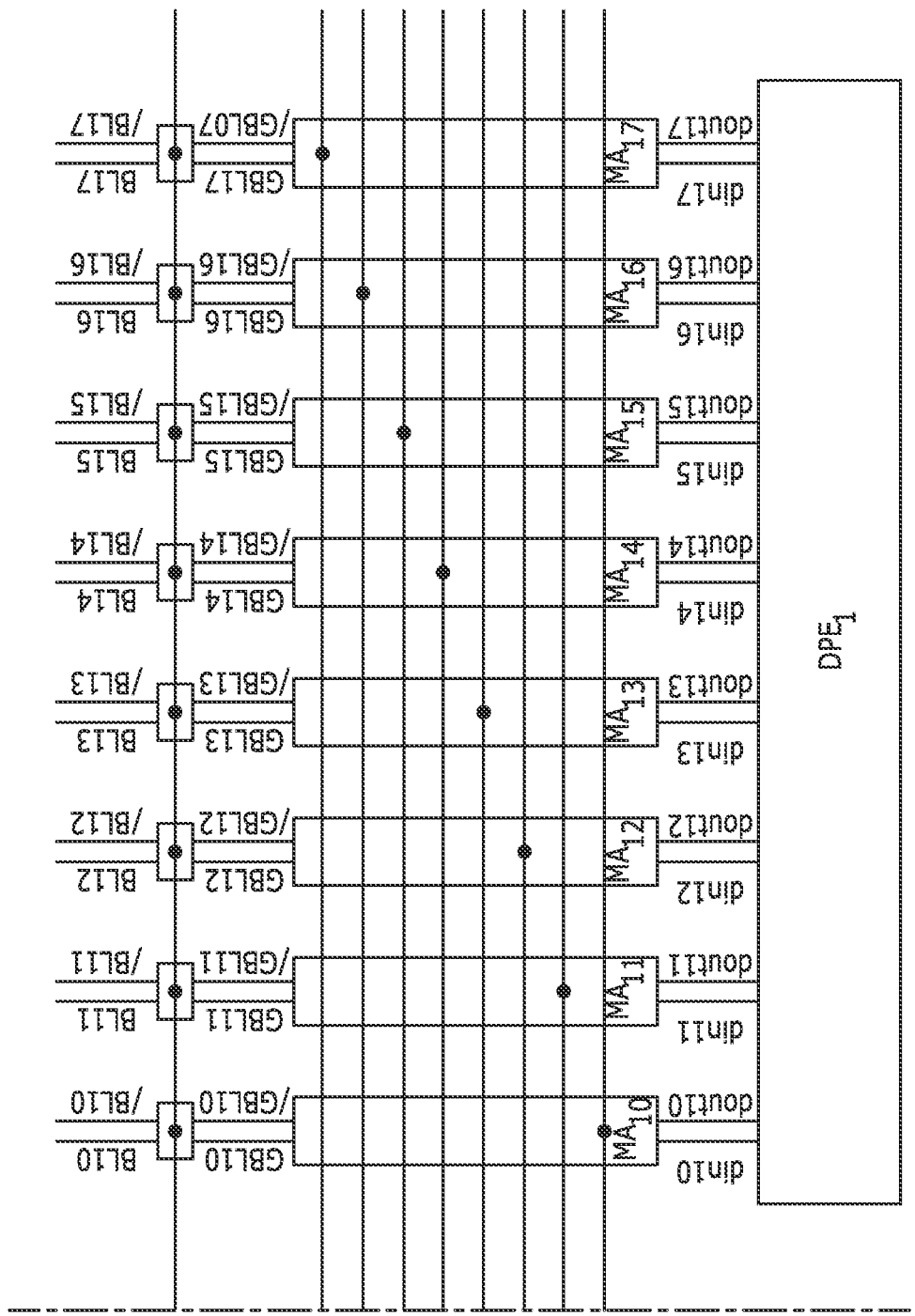

Therefore, as shown in FIG. 4, the MA of FIGS. 2a and 2b can be used for the cache memory of FIG. 3 (i.e. $MA_{00}$ . . . $MA_{17}$), where each bitline BLi and complementary bitline /BLi are connected to a respective SRAM MC (FIGS. 2a and 2b) and accessed via a WL that corresponds to the cache line in the memory system of FIG. 3. As discussed above, in emerging memories such as AI systems, all the MCs along a selected WL are simultaneously read or written (for example from/to a Deep-learning Processing Element (DPE)). Thus, when operating as a write cache, write data is latched into the MA through the WEi transmission gate. Before each write, MA is reset or precharged by /$PE_{MA}$ (see FIG. 2c) and then write data is input to MA through the WEi gate, and finally the write data is amplified by MA in response to enable signals MEi and /MEi. If the data needs to be written to the SRAM MC as well (i.e. a write-through cache), the write data amplified by MA is transferred to MC via the transmission gates upon receipt of the gate control signals YL and /YL and enabling the word line (WL). The MA cache retains the write data until it is next accessed.

When operating as a read cache, the read signal from the MC is applied to MA through transmission gates controlled by YL and /YL, and is amplified by MA as in conventional SRAM. Once MA amplifies the signal by application of the ME and /ME signals, it retains the data until the MA is next accessed. In order to keep MA active, the bit line precharge signal, /$PE_{BL}$ is separate from the MA precharge signal, /$PE_{MA}$, and the GBL and /GBL lines are separated from BL and /BL by the transmission gates controlled by YL and /YL.

Figure 5:
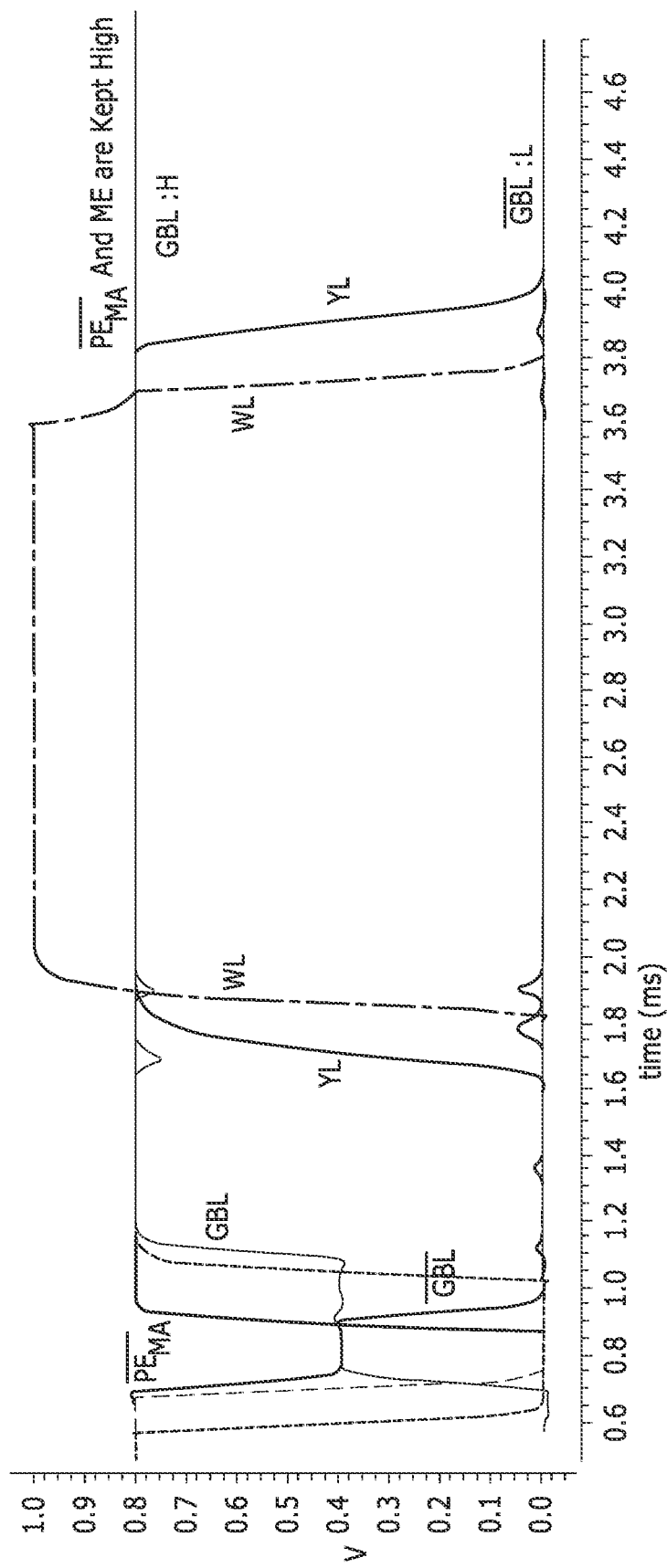
FIG. 5 shows signals for performing a write mask, according to an embodiment.

FIG. 5 shows signals for performing a write mask, according to an embodiment, wherein $MA_{02}$ and $MA_{05}$ of FIG. 4 hold data ($GBL_{02}$, /$GBL_{02}$, $GBL_{05}$, /$GBL_{05}$) as a cache memory. Each $DPE_0$/$DPE_1$ shown in FIG. 4 writes/reads eight bits din and dout (8b-DPE) via eight MAs ($MA_{00}$~$MA_{07}$), although in embodiments din and dout of a DPE and the number of MAs per DPE need not be restricted in number to eight. In normal write cache mode of operation, each MA must be written to. Before the MA is written to, the MA holds data as a cache memory. When the MA cache is renewed, GBL and /GBL are first reset by the /$PE_{MA}$ signal. Then, the write data (in the 0.4V voltage domain), is written into MA through the WE control transistor. After that, ME activates MA to amplify the write data to the 0.8V voltage domain. In the case of a write mask, some of the MAs are not renewed or not written in write cache mode. For example, if $MA_{02}$ and $MA_{05}$ are to be masked, then $MA_{00}$, $MA_{01}$, $MA_{03}$, $MA_{04}$, $MA_{06}$ and MA07 are renewed or written with new data, while $MA_{02}$ and $MA_{05}$ retain the previous data. To realize the write mask, signals, WE, /$PE_{MA}$, ME, /ME, are divided into eight signals corresponding to each MA, that is $WE_{00}$~$WE_{07}$, /$PE_{MA00}$~/$PE_{MA07}$, $ME_{00}$~$ME_{07}$, and /$ME_{00}$~/$ME_{07}$. In the case where $MA_{02}$ and $MA_{05}$ are masked, $WE_{02}$, $WE_{05}$, /$PE_{MA02}$, /$PE_{MA05}$, $ME_{02}$, $ME_{05}$, /$ME_{02}$, and /$ME_{05}$ are not asserted so that $MA_{02}$ and $MA_{05}$ retain the previous data. The held data in $MA_{02}$ and $MA_{05}$ can then be re-written into the bit cell when the transmission gate controlled by YL and /YL is activated.

Figures 6A, 6B:
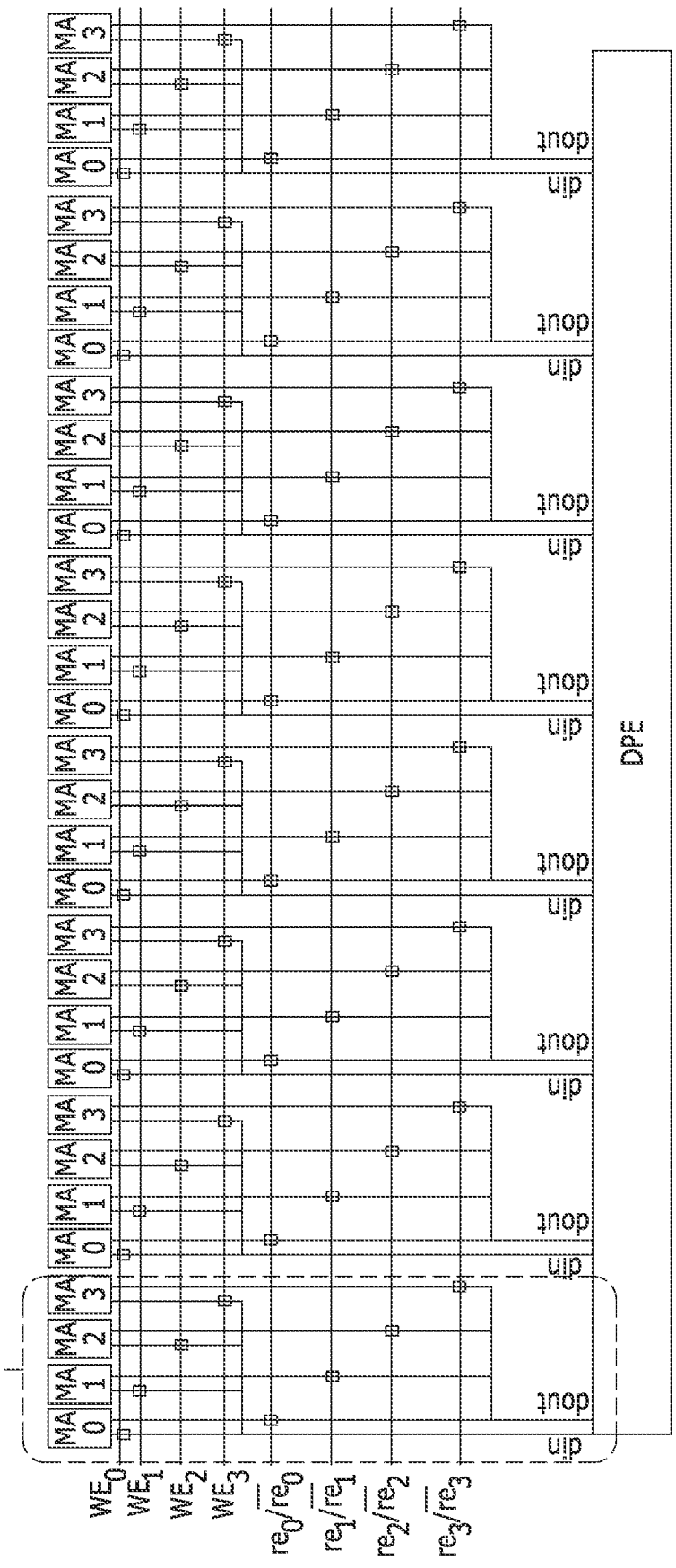
FIG. 6a illustrates an 8b-DPE having 32 columns.
FIG. 6b shows a detail of FIG. 6a, according to an embodiment.
Figure 6B:
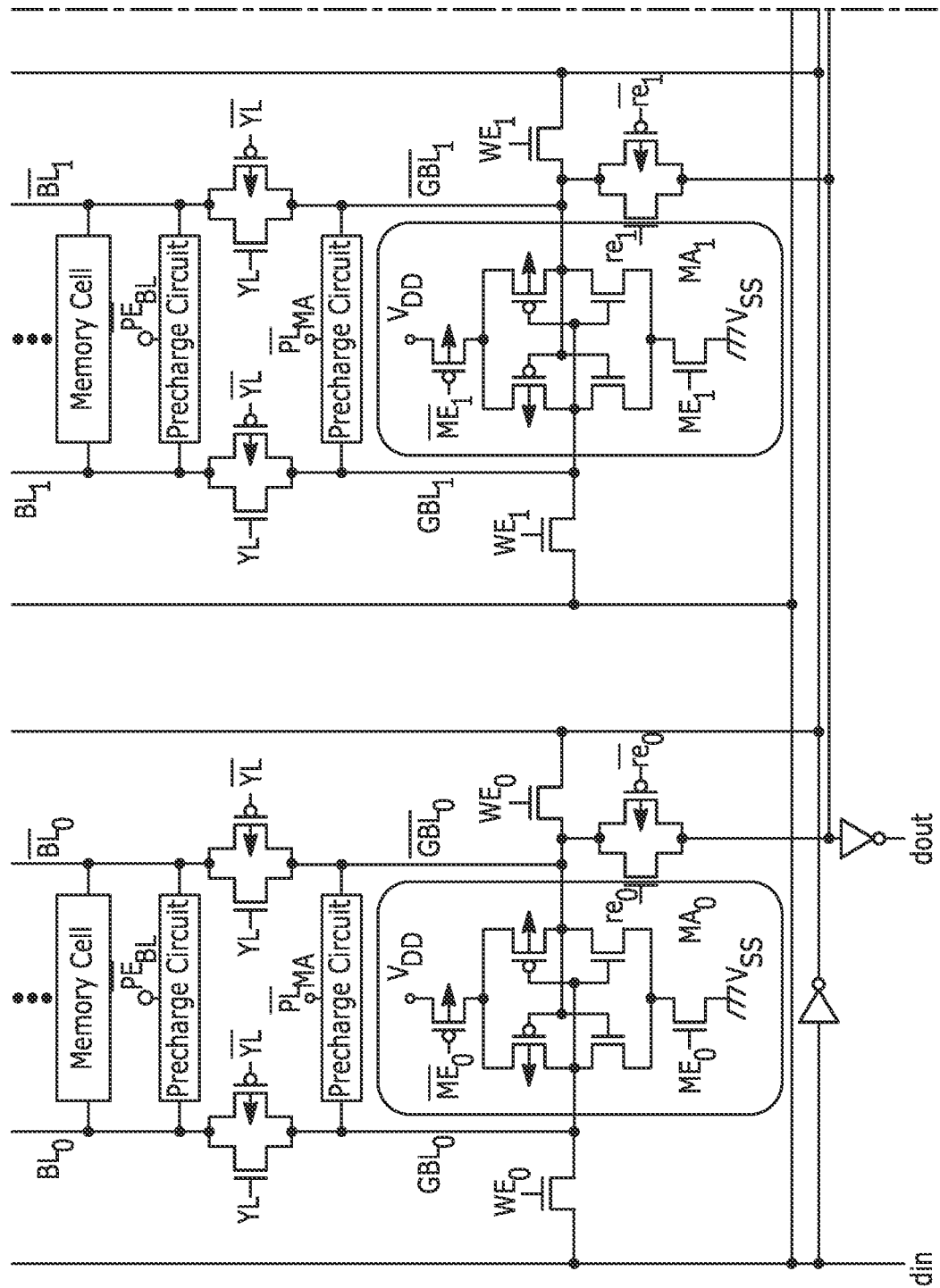
Figure 6B:
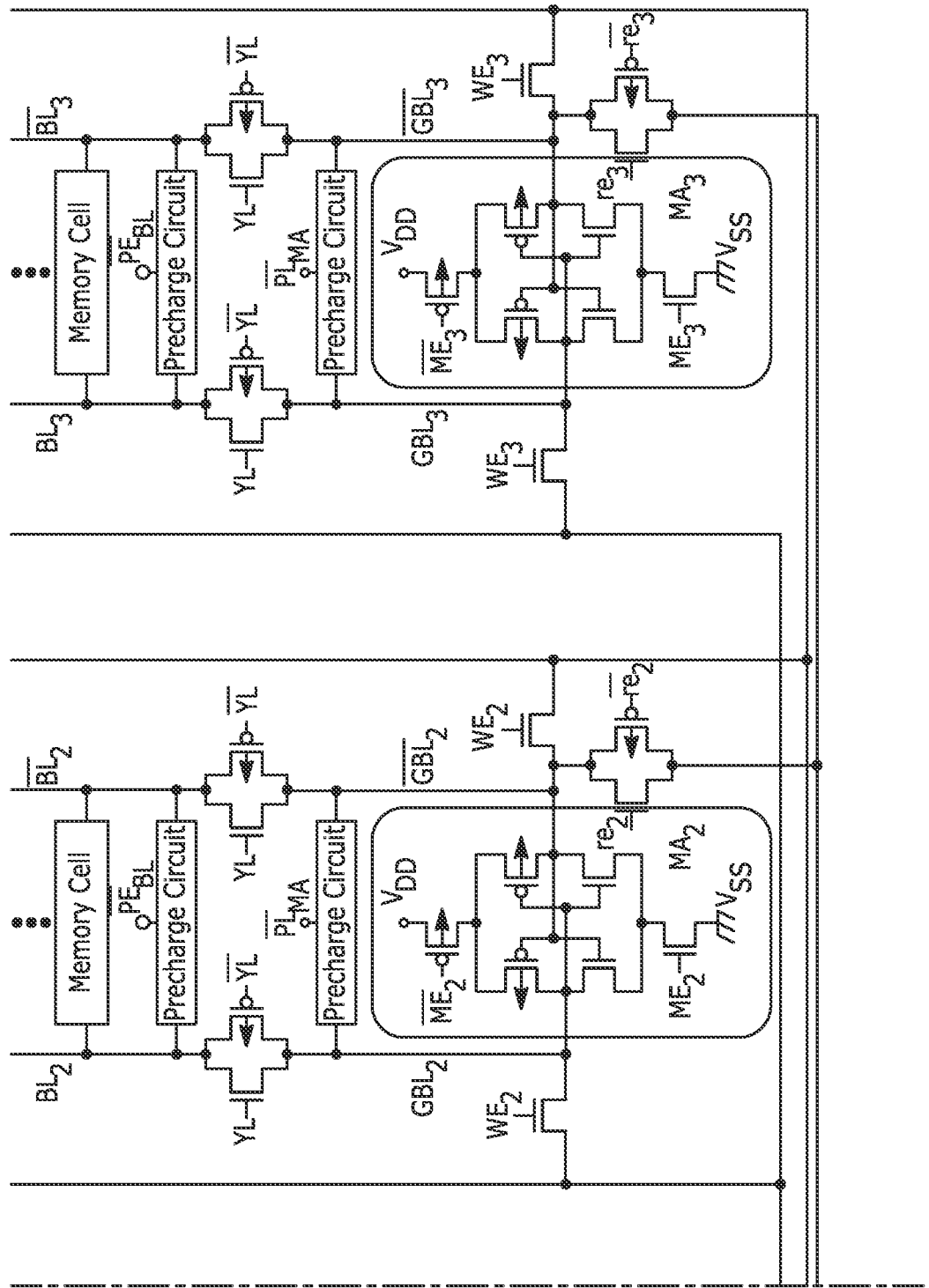

In some embodiments, for example in an AI chip, the layout area of the 8b-DPE can be widened to 32 columns width or 32 MAs width, as shown in FIG. 6a, where an 8b-DPE is connected to 8 MAs with one MA selected from every four MAs and eight MAs selected and connected to one 8b-DPE, for 32 MAs in total. However, as discussed above, embodiments are not restricted to 8b-DPE, but are applicable to Nb-DPE, where N can be 4, 8, 16, and so on. FIG. 6b shows a detail of FIG. 6a for four MAs ($MA_0$, $MA_1$, $MA_2$, $MA_3$), according to an embodiment.

Figure 7:
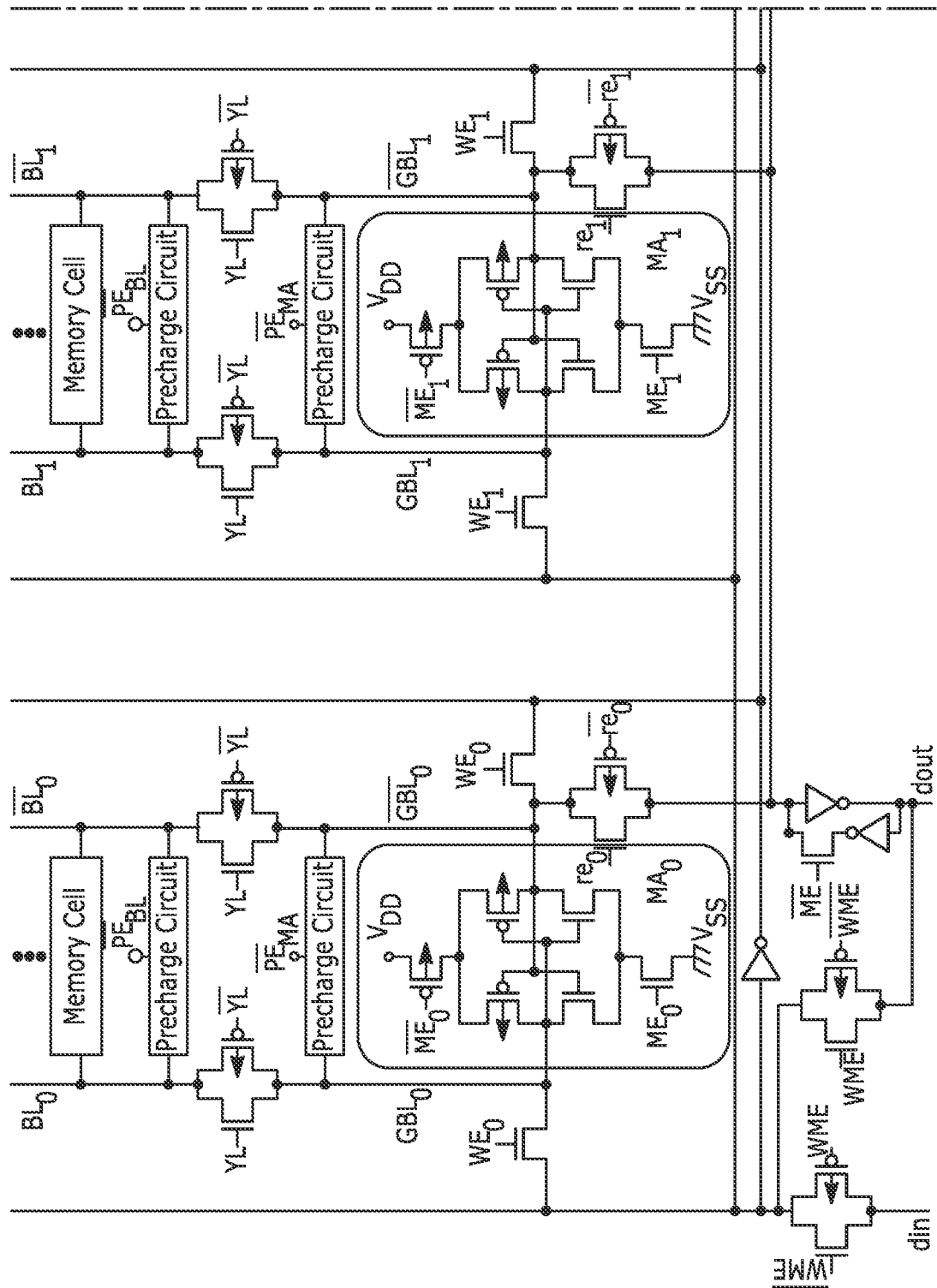
FIG. 7 shows circuitry applied to four main amplifiers (MAs) in FIG. 6b for performing a write mask.
Figure 7:
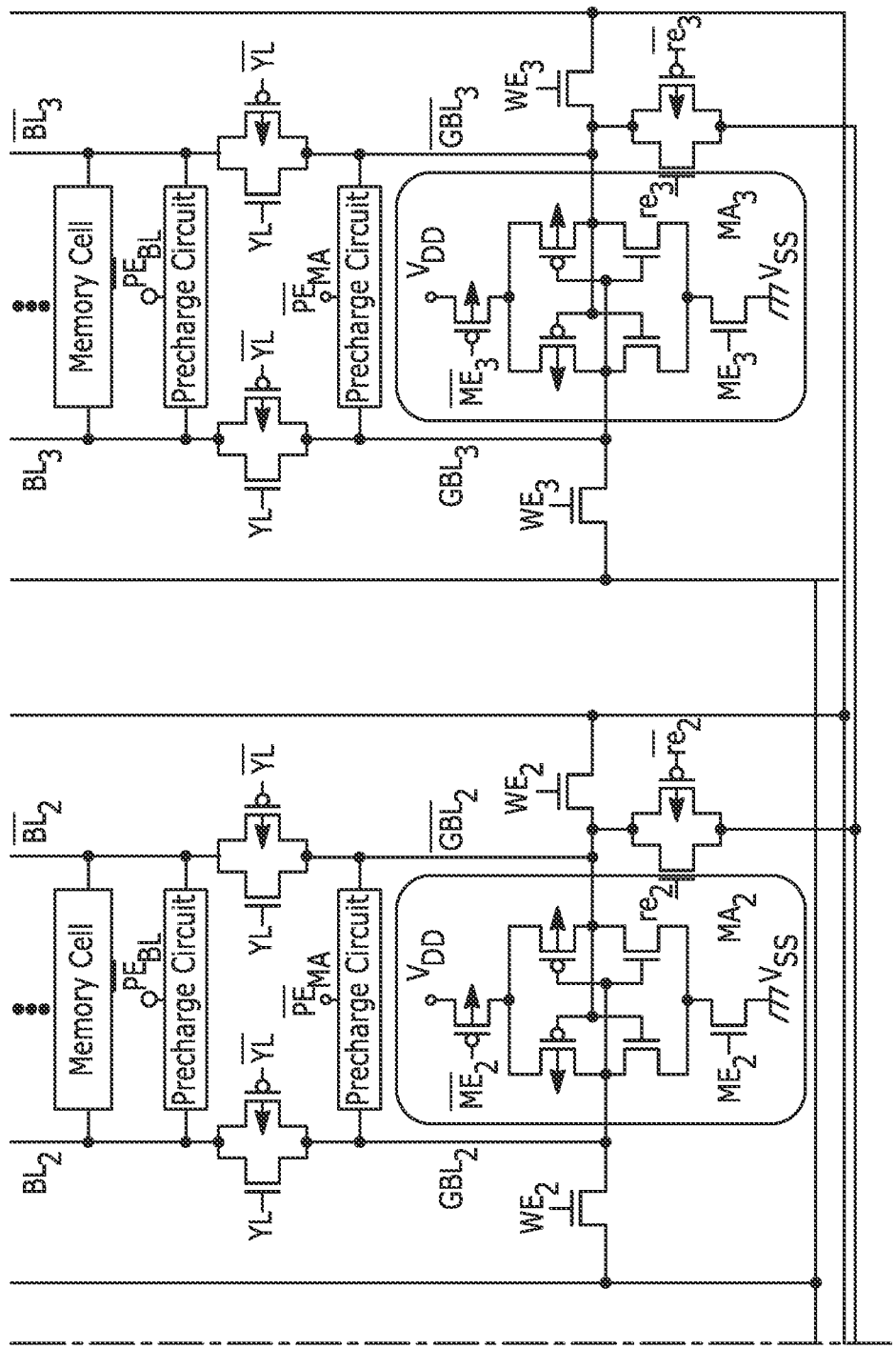

FIG. 7 shows circuitry applied to the four MAs ($MA_0$, $MA_1$, $MA_2$, $MA_3$) of FIG. 6b for performing a write mask, where the write mask is applied to only one MA in each four-MA group. Two write data path are provided, that is, a regular din path which is input to the MA in normal mode where Write Mask Enable (WME) is not asserted, and a data path where WME is asserted. When WME is asserted (i.e. for write mask mode), the regular din path is closed, and data from the data latch is input into MA through the WME asserted transmission gate. The latched data is the read cache data held from the previous cycle. The latch holds data when ME turns off and the read cache is reset or the mask write cycle starts. The masked MA writes the previous data which has been held in the MA cache, using the latch data, so that the masked MA retains the read cache data during write cache mode. In this circuit, mask flexibility is limited to only one MA, however, only one /$PE_{MA}$, four WE, four ME, and four /ME are needed, which is simpler compared to the circuit of FIG. 4 in which all eight WE, /PE, ME, /ME signals are needed for each.

Figure 8:
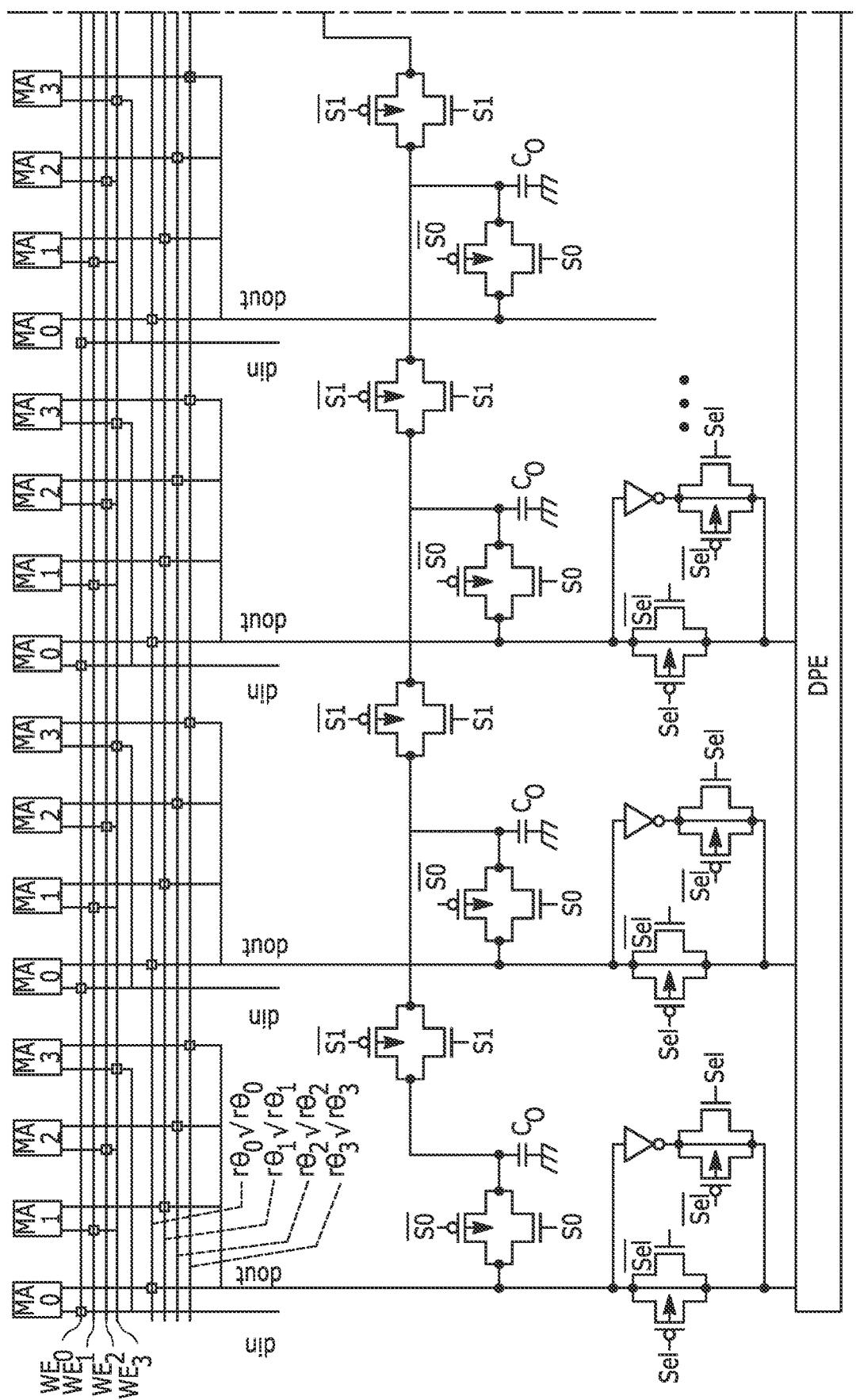
FIG. 8 shows circuitry for performing a data inversion utilizing charge shared level comparison with half Vdd when the 32 column 8b-DPE of FIG. 6a is operating as a read cache.
Figure 8:
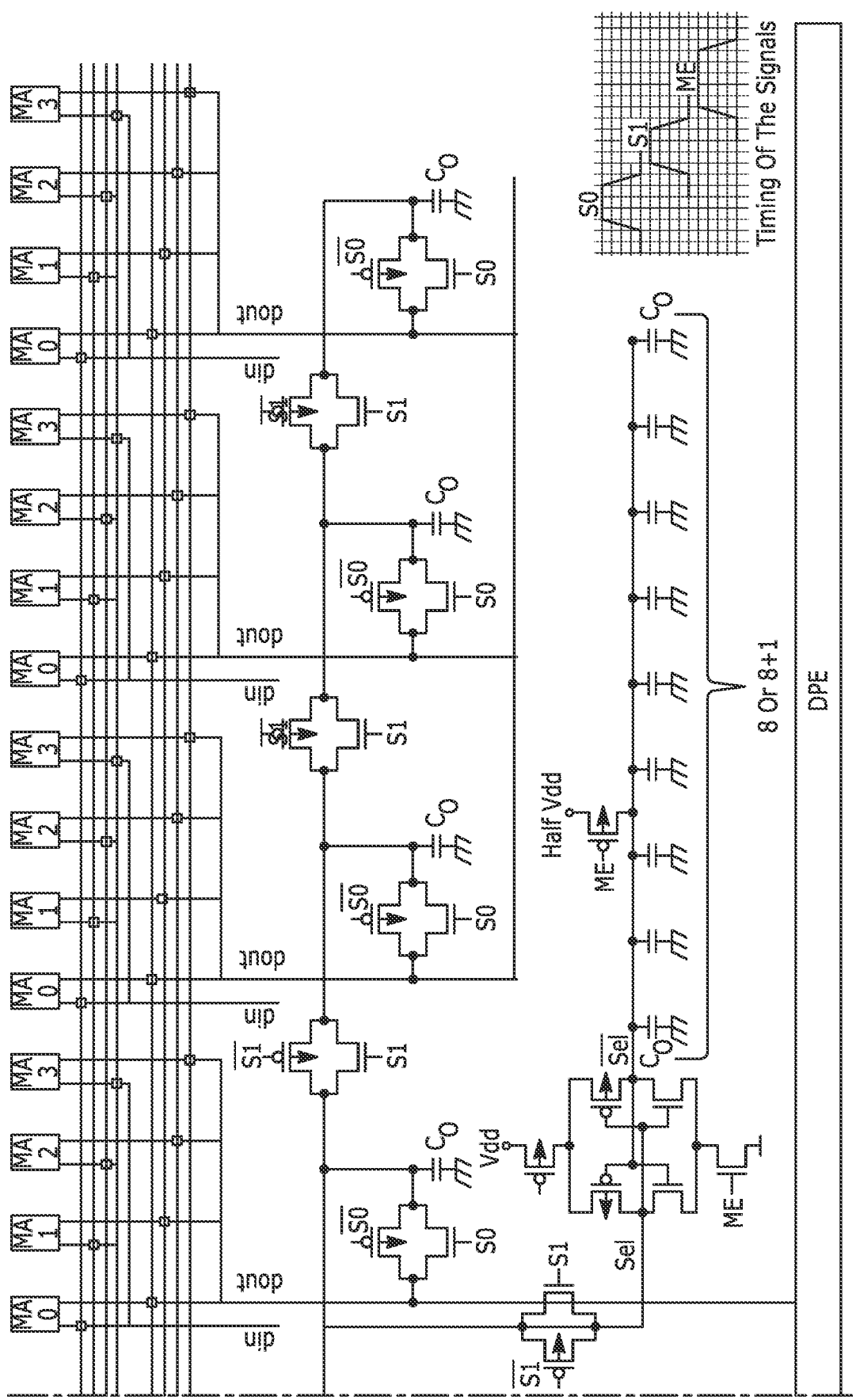

As discussed above, when operating as a read cache, where the MA retains data until the MA is next accessed, the dout swing power can be reduced by inverting the dout data by utilizing a half Vdd voltage, as shown in the embodiment of FIG. 8, where each dout charges up capacitance $C_0$ according to the S0 signal timing, and then each capacitance is shorted according to the S1 signal timing. At this stage, if the majority of the data on the dout lines is high (i.e. Vdd level), the charge is shared, and the shorted voltage will be larger than half Vdd. The shorted voltage is compared with half Vdd by the MA, and the resulting dout of the MA is selectively inverted by application of signals, sel and /sel which control respective gates to select either normal data or inverted data. Conventionally, if a majority of five out of eight dout lines is high, a combination of 8C5=57 logic gates is required, whereas the circuit of FIG. 8 using charge sharing and half Vdd comparison results in a much simplified circuit.

Figure 9A:
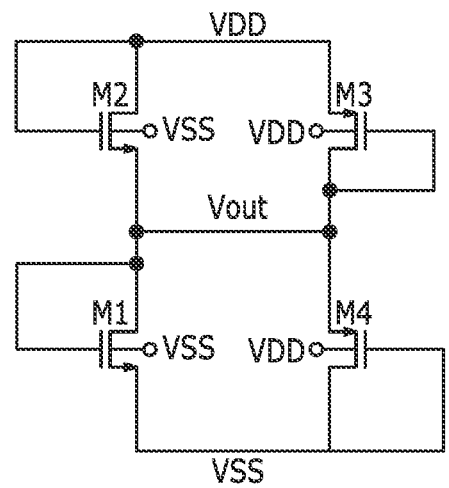
FIG. 9a. shows an alternate circuit for generating the half Vdd voltage.
Figure 9B:
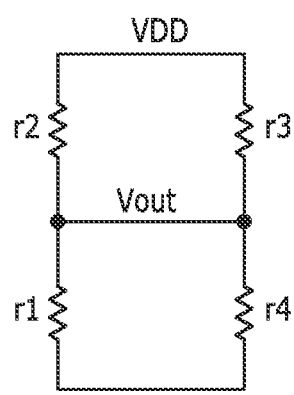
FIG. 9b is an equivalent circuit thereof and FIG. 9c is a resistance circuit thereof be simplified using small signal analysis.
Figure 9C:
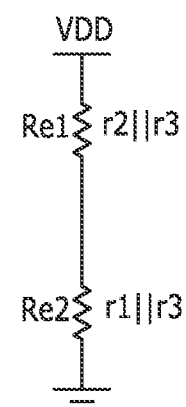

FIG. 9a. shows an alternate circuit for generating the half Vdd voltage for the precharge circuit of FIG. 2c, from the main on-chip supply voltage and for tracking changes in the main voltage supply with a minimum number of transistors so that it occupies minimal space on the chip. In the circuit of FIG. 9a, devices M1 and M3 comprise a self-biased inverter and devices M2 and M4 are current sensing devices that are always turned on. An equivalent circuit of FIG. 9a is shown in FIG. 9b, which can be simplified using small signal analysis to a resistance circuit as shown in FIG. 9c. The equivalent resistance can be calculated as follows:

$$R_{e1} = \frac{r_2 r_3}{r_2 + r_3} \quad (1)$$

$$R_{e1} = \frac{1}{r_2} + \frac{1}{r_3} \quad (2)$$

$$\frac{1}{R_{e1}} = gm_2 + gds_3 \quad (3)$$

Therefore, Re1 is $$R_{e1} = \frac{1}{gm_2 + gds_3} \quad (4)$$

Re2 can be calculated as $$R_{e2} = \frac{r_1 r_4}{r_1 + r_4} \quad (5)$$

$$\frac{1}{R_{e2}} = \frac{1}{r_1} + \frac{1}{r_4} \quad (6)$$

$$\frac{1}{R_{e2}} = gds_1 + gm_4 \quad (7)$$

$$R_{e2} = \frac{1}{gds_1 + gm_4} \quad (8)$$

Therefore, Vout is $$Vout = VDD \frac{gds_1 + gm_4}{gds_1 + gm_4 + gm_2 + gds_3} \quad (11)$$

The output impedance is therefore $$Rout = \left(\frac{1}{gm_1}\right) \| \left(\frac{1}{gm_2}\right) \| \left(\frac{1}{gm_3}\right) \| \left(\frac{1}{gm_4}\right) \quad (12)$$

From the foregoing it will be noted that the circuit of FIG. 9a tracks the change in the main supply voltage and replicates the change at the output.

In terms of DC analysis, the sum of the currents through M2 and M3=the sum of currents through M1 and M4. Therefore $$I_2 + I_3 = I_1 + I_4 \quad (13)$$

$$I_n = \left(\frac{1}{2}\right)\mu_n Cox\left(\frac{W}{L}\right)(V_{gs} - V_{th})^2 \quad (14)$$

$$I_p = \left(\frac{1}{2}\right)\mu_p Cox\left(\frac{W}{L}\right)(V_{sg} - |V_{thp}|)^2 \quad (15)$$

For equal impedance seen through NMOS and PMOS $$\mu_n Cox\left(\frac{W}{L}\right)_{1,2} = \mu_p Cox\left(\frac{W}{L}\right)_{3,4} \quad (16)$$

Therefore $$(V_{DD}-V_0-V_{th2})^2+(V_{DD}-V_0-|V_{thp3}|)^2=(V_0-V_{th1})^2+(V_0-|V_{thp4}|)^2 \quad (17)$$

If $$V_{th2}=|V_{thp3}|=V_{th1}=|V_{thp4}| \quad (18)$$

Then neglecting body effect, $$V_O = \frac{V_{DD}}{2} \quad (19)$$

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A static random-access memory comprising:
   at least one six-transistor memory cell arranged between a first bitline, a second bitline and a word line;
   a bitline precharge circuit for precharging the first bitline and second bitline to a voltage of Vdd/2 prior to the at least one six-transistor memory cell receiving a word line signal;
   a main amplifier for receiving signals on data lines din and/din in a first voltage domain via a gate WEi; and
   a main amplifier precharge circuit for precharging the main amplifier in response to a signal/PEMA such that the main amplifier amplifies signals in the first voltage domain to a second voltage domain, wherein the main amplifier functions as a write amplifier for amplifying a lower voltage on din to higher write voltage for writing to the at least one six-transistor memory cell.

2. The static random-access memory of claim 1, wherein the first voltage domain is din=0.4V and/din=0 V and the second voltage domain is din=0.8V and/din=0 V.

3. The static random-access memory of claim 1, further comprising a pair of transmission gates for connecting the first bitline and second bitline to global bit line busses GBL and/GBL, respectively, in response to YL and/YL gate signals, respectively.

4. The static random-access memory of claim 3, wherein the main amplifier precharge circuit precharges the global bit line busses GBL and/GBL before the main amplifier receives signals on data lines din and/din and independently of the bitline precharge circuit precharging the first bitline and second bitline.

* * * * *